United States Patent [19]
Clouser et al.

[11] Patent Number: 5,243,320
[45] Date of Patent: Sep. 7, 1993

[54] RESISTIVE METAL LAYERS AND METHOD FOR MAKING SAME

[75] Inventors: Sidney J. Clouser, Chardon; Chinho Lee, Lyndhurst; Mary K. Prokop, Cleveland Heights; Christopher J. Whevell, Willoughby, all of Ohio

[73] Assignee: Gould Inc., Eastlake, Ohio

[21] Appl. No.: 750,070

[22] Filed: Aug. 26, 1991

Related U.S. Application Data

[63] Continuation-in-part of Ser. No. 615,927, Nov. 20, 1990, abandoned, which is a continuation of Ser. No. 307,493, Feb. 9, 1989, abandoned, which is a continuation-in-part of Ser. No. 160,794, Feb. 26, 1988, abandoned, and a continuation-in-part of Ser. No. 160,795, Feb. 26, 1988, abandoned.

[51] Int. Cl.$^5$ .................................................. H01C 1/012
[52] U.S. Cl. ........................................ 338/308; 338/309; 428/607; 428/621; 361/765
[58] Field of Search ............... 338/309, 307, 308, 314, 338/306; 428/601, 620, 607, 666, 674, 675, 621, 935, 626; 361/402

[56] References Cited

U.S. PATENT DOCUMENTS

| | | |
|---|---|---|
| 2,643,221 | 6/1953 | Brenner et al. .......................... 204/43 |
| 2,662,957 | 12/1953 | Eisler ........................................ 338/2 |
| 2,671,950 | 3/1954 | Sukacev ................................ 29/155.5 |
| 3,006,819 | 10/1961 | Wilson et al. ............................ 204/15 |
| 3,077,442 | 2/1963 | Koretzky ................................. 204/37 |
| 3,218,194 | 11/1965 | Maissel ................................. 117/217 |
| 3,287,161 | 11/1966 | Schwertz et al. ..................... 117/212 |
| 3,392,054 | 7/1968 | Sapoff et al. ......................... 117/217 |
| 3,423,260 | 1/1969 | Heath et al. .......................... 361/402 |
| 3,493,352 | 2/1970 | Wright et al. ....................... 29/183.5 |
| 3,511,246 | 5/1970 | Westerbarkey ....................... 138/154 |
| 3,522,085 | 7/1970 | Watanabe ............................. 420/675 |
| 3,607,389 | 9/1971 | Caneyallo ............................. 330/308 |
| 3,611,246 | 10/1971 | Beue ..................................... 330/308 |
| 3,645,783 | 2/1972 | Rupert et al. ........................ 117/212 |
| 3,654,101 | 4/1972 | Aoun ..................................... 204/51 |
| 3,663,241 | 5/1972 | Short ....................................... 106/1 |
| 3,691,007 | 9/1972 | Pavion .................................. 161/213 |
| 3,743,583 | 7/1973 | Castonguay ........................... 204/207 |
| 3,781,596 | 12/1973 | Galli et al. ........................... 174/68.5 |
| 3,808,576 | 4/1974 | Castonguay et al. ................ 338/308 |
| 3,857,683 | 12/1974 | Castonguay et al. ................ 428/626 |
| 3,878,006 | 4/1975 | Rice ...................................... 156/655 |
| 3,947,277 | 3/1976 | Carnahan et al. ................. 252/506 X |

(List continued on next page.)

OTHER PUBLICATIONS

"Film Microelectronics", Mir. Moscow 1968, pp. 23–37.

"Thin Film Production Processes", by R. Berry et al., Energiya, Moscow 1972, pp. 300–303.

"Handbook on Printed Circuits", Sovyetskoe Radio, Moscow 1972, p. 312.

"Production Process for Integrated Microcircuits and Microprocessors" by V. N. Chernyavev Radio Svyaz Moscow 1987, p. 223.

"Etching Printed Circuit Board Sandwich Eliminates Discrete Resistors" by Ertel and Mars, Electronics, May 10, 1973.

"Testing SMT Printed Circuit Boards in the 1990's," by G. Hroundas, Jan. 9, 1989, Smart V Conferences.

"Planar Resistor Technology for High Speed Multilayer Boards", by B. Mahler, Electronic Packing & Production, Jan. 1986, pp. 150–154.

*Primary Examiner*—Marvin M. Lateef
*Attorney, Agent, or Firm*—Renner, Otto, Boisselle & Sklar

[57] ABSTRACT

Electrodeposited planar resistive layers are disclosed, which may be combined with conductive layers and insulative layers to produce laminates useful in the preparation of printed circuit boards. The resistive layers are prepared by electroplating from an electroplating bath containing a source of a normally conductive metal component and a source of a non-metallic resistance increasing additive. Planar resistors may be produced which have sheet resistances in the range of from about 15 to about 1000 Ω per square.

27 Claims, 2 Drawing Sheets

U.S. PATENT DOCUMENTS

| | | | |
|---|---|---|---|
| 3,958,317 | 5/1976 | Peart et al. | 428/601 |
| 3,981,691 | 9/1976 | Cuneo | 428/626 |
| 4,010,005 | 3/1977 | Morisaki et al. | 428/607 |
| 4,131,517 | 12/1978 | Mitsuo | 204/27 |
| 4,190,474 | 2/1980 | Berdan et al. | 204/27 |
| 4,204,935 | 5/1980 | Klosse et al. | 338/308 |
| 4,208,698 | 6/1980 | Narasimhan | 361/414 |
| 4,234,396 | 11/1980 | Perakh et al. | 204/51 |
| 4,301,439 | 11/1981 | Johnson et al. | 338/195 |
| 4,387,137 | 6/1983 | Rice | 428/332 |
| 4,411,768 | 1/1982 | Berdan et al. | 423/626 |
| 4,414,274 | 11/1983 | Hieber | 428/336 |
| 4,444,848 | 4/1984 | Shanefield et al. | 428/675 |
| 4,448,648 | 5/1984 | Barclay et al. | 204/51 |
| 4,450,050 | 5/1984 | Chessin et al. | 204/41 |
| 4,469,567 | 9/1984 | Torday et al. | 204/27 |
| 4,532,186 | 7/1985 | Shibagaki et al. | 428/457 |
| 4,554,219 | 11/1985 | Gamblin | 428/667 |
| 4,572,768 | 2/1986 | Wolski et al. | 204/15 |
| 4,648,947 | 3/1987 | Naismith et al. | 204/51 |
| 4,682,143 | 7/1987 | Chu et al. | 338/308 |
| 4,694,121 | 9/1987 | Ota | 174/68.5 |
| 4,713,494 | 12/1987 | Oikawa | 174/68.5 |
| 4,737,757 | 4/1988 | Senda et al. | 338/308 |
| 4,808,967 | 2/1989 | Rice | 428/667 |

FOREIGN PATENT DOCUMENTS

| | | |
|---|---|---|
| 214057 | 6/1956 | Australia . |
| 217332 | 9/1957 | Australia . |
| 406103 | 5/1967 | Australia . |
| 416713 | 1/1969 | Australia . |
| 465334 | 8/1975 | Australia . |
| 7598A1 | 3/1951 | European Pat. Off. . |
| WO8607100 | 12/1986 | PCT Int'l Appl. . |
| 690691 | 4/1953 | United Kingdom . |
| 1211494 | 11/1970 | United Kingdom . |
| 1349696 | 4/1974 | United Kingdom . |
| 1383524 | 2/1975 | United Kingdom . |
| 1419613 | 12/1975 | United Kingdom . |
| 1464531 | 2/1977 | United Kingdom . |
| 2010910A | 7/1979 | United Kingdom . |
| 2158100A | 11/1985 | United Kingdom . |

RESISTIVE METAL LAYERS AND METHOD FOR MAKING SAME

This is a continuation-in-part of copending application Ser. No. 07/615,927 filed on Nov. 20, 1990, abandoned, which is a continuation of Ser. No. 07/307,493 filed on Feb. 9, 1989, abandoned, which is a continuation-in-part of Ser. No. 07/160,794 filed on Feb. 26, 1988, abandoned, and Ser. No. 07/160,795 also filed on Feb. 26, 1988, abandoned.

FIELD OF THE INVENTION

The invention of the present application relates to the field of precursor materials for printed circuit boards and to methods for making and using such materials. More particularly the invention relates to electrodeposited electrically resistive metal layers, multiple layer foils which include such resistive layers, laminates which include an insulative layer, an electrodeposited resistive metal layer and a conductive layer, printed circuit boards which include an insulative layer and a resistive line bonded to the insulative layer, and methods for preparing each of the foregoing.

BACKGROUND OF THE INVENTION

Since the pioneering inventions of Strong et al., disclosed in British Patent No. 690,691, published Apr. 29, 1953, printed circuit board (PCB) technology has become an extremely important facet of the modern electronics industry, PCB technology has been facilitated by the development of cladding and related electrodeposition processes for producing thin foils for use as conductor materials. In an effort to minimize the space requirements on PCB components, the industry has turned to planar resistor technology, and in particular to electrodeposited resistive layers in an effort to increase circuit density, improve reliability and operating characteristics and reduce overall cost, especially by increasing manufacturing automation. These prior activities are summarized in an article of Mahler entitled "Planar Resistor Technology for High-Speed Multilayer Boards", *Electronic Packaging & Production*, January, 1986, pp 151-154.

Important advances in the field of etchable electrodeposited layers of resistive materials have been made by Castonguay, as disclosed in the U.S. Pat. No. 3,857,683, by Castonguay et al., as disclosed in U.S. Pat. No. 3,808,576 and by Rice et al., as disclosed in International Application No. PCT/US86/01173, published as International Publication No. WO 86/07100.

A large number of binary alloys are disclosed in U.S. Pat. No. 3,857,683 as being useful as resistive layers. However, most of these alloys have specific resistivities which are too low for practical commercial uses. Moreover, in many cases the ingredients necessary in the respective electroplating baths for producing the alloys are exotic and expensive and in some cases difficult and/or dangerous to handle. For example, in Examples XI and XXXI of the '683 patent, fluoborates of antimony and either cobalt or nickel and fluoboric acid are needed to prepare cobalt.antimony and nickel.antimony alloys respectively. Additionally, this prior publication provides no guidance whatsoever with regard to particular etchants or etching conditions which might be successfully employed to prepare printed circuits from a given binary alloy.

In any event, for one reason or another, and as illustrated in U.S. Pat. No. 3,808,576 and International Publication No. WO 86/07100, the nickel.phosphorous alloys have become the most widely used materials for PCB precursor resistive layer applications. In the 07100 International Publication, nickel.phosphorous resistance layers are plated onto copper foil from a plating bath free of sulfate and chloride salts. This reference specifically teaches that the use of such salts should be avoided because they cause embrittlement. Thus, the plating bath comprises nickel carbonate, phosphoric acid and phosphorous acid. In the '576 patent, the resistive layer includes up to 30% by weight phosphorous and the bath from which it is electrodeposited contains nickel sulfate hexahydrate, nickel chloride hexahydrate, nickel carbonate, phosphoric acid and phosphorous acid, as well as other additives. The use of so many reagents for forming the nickel.phosphorous layer, however, is technically cumbersome and tends to increase the cost of producing a commercially suitable resistive layer. Moreover, it is generally thought to be necessary to anodize the resistive alloy into oxides after the same has been electroplated onto a copper foil surface. This also results in added cost and inconvenience.

Thus, in spite of the advances in the art of providing electrodeposited planar resistance layers, those skilled in such art have continued to search for resistive materials which might be electrodeposited conveniently and reproducibly to provide a resistive layer which is readily etchable using safe etchants to provide printed circuit components having resistance lines and segments that have commercially appropriate and valuable resistance characteristics. The invention disclosed in the present application provides such resistive layers, components which incorporate such layers and methods and plating baths for making the same.

SUMMARY OF THE INVENTION

The invention disclosed in this application provides a resistive layer and multiple layer foils, laminates and printed circuit boards having the resistive layer.

The resistive layer comprises an electrodeposited layer of a composite of a normally conductive metal component and a resistance increasing amount of a non-metallic additive.

The multiple layer foil of the invention comprises a conductive layer and the resistive layer of the present invention.

The laminate of the invention comprises an insulative layer having the electrodeposited resistive layer of the present invention adhered thereto. In this aspect of the invention the laminate may also comprise a conductive layer adhered to the resistive layer.

The printed circuit board of the invention comprises an insulative layer and a resistive line bonded to the insulative layer. The resistive line is composed of an electrodeposited material which comprises a composite of a normally conductive metal component and a resistance increasing amount of a nonmetallic additive.

The invention described herein also provides a method for electrodepositing a resistive layer, including a method for electrodepositing a resistive layer having a pre-selected sheet resistance or resistivity. This method comprises the steps of (A) providing a plating bath comprising an aqueous solution of a first source of a normally conductive metal component and a second source of a nonmetallic resistance increasing additive comprising carbon or nitrogen, or a combination of two or more of carbon, nitrogen and phosphorus;

(B) placing a conductive member in said bath; and (C) electroplating a layer comprising a composite of said metal component and said additive on said conductive member by passing an electric current through the bath using said conductive member as a cathode.

Another aspect of the invention is the plating bath for electrodepositing resistive layers comprising an aqueous solution of a first source of a normally conductive metal component and a second source of a non-metallic resistance increasing additive comprising carbon or nitrogen, or a combination of two or more of carbon, nitrogen and phosphorus.

Another aspect of the invention is methods for preparing a printed circuit board having at least one resistive line composed of a composite of the invention and a conductive area on an insulative layer. Included in this aspect of the invention are methods for selective etching of the conductive foil layer and the resistive layer, respectively In one embodiment of this aspect of the invention, a method for preparing a printed circuit board having a chromium-containing resistive line and a conductive metal area on an insulative layer is provided comprising the sequential steps of:

(A) providing a laminate having an insulative layer, a resistive layer bonded to the insulative layer and a conductive metal foil layer comprising a major amount of a conductive metal other than chromium affixed to the resistive layer comprising a composite of a normally conductive metal component and a resistance increasing amount of a non-metallic additive, the metal component comprising chromium and the non-metallic additive comprising carbon or nitrogen, or a combination of two or more of carbon, nitrogen and phosphorus, in the bulk of the resistive layer;

(B) masking the laminate with a first mask;

(C) contacting the laminate having the first mask thereon with a first etchant capable of preferentially etching the metal foil layer relative to the resistive layer to remove the conductive foil layer from the resistive chromium layer not covered by the first mask;

(D) contacting the laminate with a second etchant comprising hydrochloric acid to remove the resistive layer from all the insulative layer not covered by the first mask;

(E) removing the first mask from the laminate;

(F) masking the laminate with a second mask; and (G) contacting the laminate having the second mask thereon with a third etchant capable of preferentially etching the conductive foil layer relative to the resistive layer to remove the conductive foil layer from the laminate not covered by the second mask while leaving behind the remaining resistive chromium layer wherein the resistive layer covered by the first mask defines a resistive chromium-containing line on the insulative layer and the conductive foil covered by the second mask defines a conductive metal area on a portion of the resistive chromium line.

In another embodiment of this aspect of the invention, a method is provided for preparing a printed circuit board having at least one resistive line composed of a nickel-containing composite and a conductive metal area on an insulative layer, comprising the sequential steps of:

(A) providing a laminate having an insulative layer, a resistive layer bonded to the insulative layer and a conductive copper foil layer affixed to the resistive layer wherein the resistive layer comprises a composite of a normally conductive metal component comprising nickel and a resistance increasing amount of the non-metallic additive other than phosphorus;

(B) masking the laminate with a first mask;

(C) contacting the laminate having the first mask thereon with a first etchant capable of etching the copper foil and the nickel-containing resistive layer to remove the conductive copper foil layer and the resistive layer from all portions of the insulative layer not covered by the first mask;

(D) removing the first mask from the laminate;

(E) masking the laminate with a second mask;

(F) contacting the laminate having the second mask thereon with a third etchant capable of preferentially etching the copper foil relative to the nickel-containing resistive layer to remove the conductive copper foil layer from all unmasked portions of the laminate while leaving behind the remaining resistive layer wherein the resistive layer covered by the first mask defines a resistive line on the insulative layer and the copper foil covered by the second mask defines a conductive copper area on a portion of the resistive line.

DESCRIPTION OF THE PREFERRED EMBODIMENTS OF THE INVENTION

Figure 1:
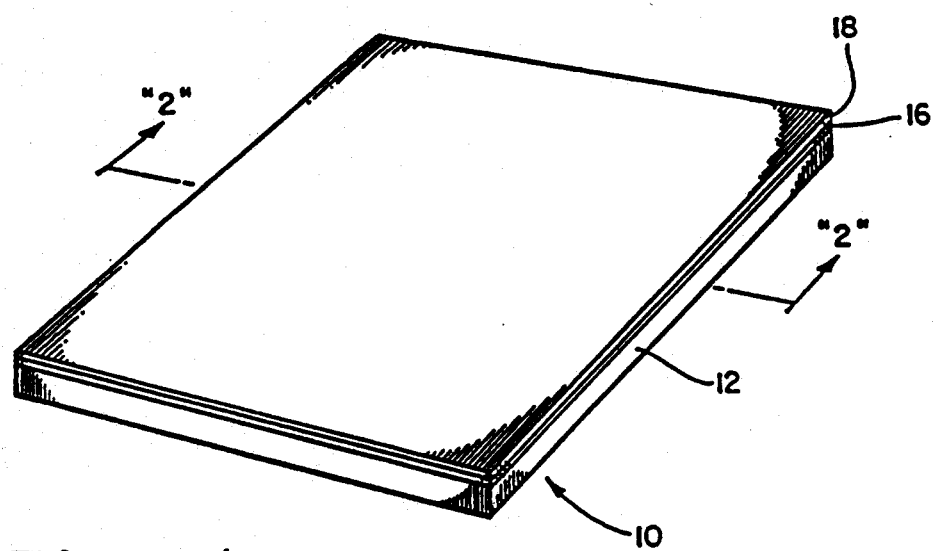
FIG. 1 is a perspective view of a laminate embodying the invention of the present application and having as components thereof an insulative layer, a resistive layer adhered to the insulative layer and a conductive layer adhered to the resistive layer.

As set forth above, the invention described herein provides electrodeposited electrically resistive metal layers, multiple layer laminates which may include an insulative layer, an electrodeposited resistive metal layer bonded to the resistive layer and a conductive layer affixed to the resistive layer, and printed circuit boards prepared from such materials. Additionally, the invention provides a bath from which the resistive metal layers of the invention may be electrodeposited and a method for utilizing such a bath. Finally, the invention provides methods for etching the laminates of the invention to prepare the printed circuit board components of the invention.

The electrically resistive material comprises an electrodeposited layer of a composite of a normally conductive metal component and a resistance increasing amount of a non-metallic additive. Any normally conductive electrodepositable metal may be used as the metal component for the purposes of the invention. Included among such normally conductive metals are members of the transition element series of the Periodic Table such as chromium, nickel, cobalt, vanadium, tungsten, molybdenum, the valve metals (e.g., titanium, zirconium, niobium, tantalum, etc.), the noble metals (e.g., ruthenium, platinum, palladium, etc.), silver, scandium, yttrium, etc., and metals which are not transition elements such as the lanthanides (e.g., cerium, thorium, etc.) and combinations thereof. For reasons of economy and/or resistor stability, chromium by itself or combined with one or more of the aforementioned metals is often preferred. In one preferred embodiment, the resistive layer comprises a major amount of chromium.

The presence of molybdenum and/or tungsten in the resistive layer is particularly advantageous for obtaining a resistive layer having a high power handling capability. In one embodiment, molybdenum and/or tungsten may be present as a minor amount relative to the total number of atoms of conductive metal in the resistive layer. In one embodiment of the invention, the atom ratio of molybdenum and/or tungsten to other conductive metals is in the range from about 0.001:1 to about 0.1:1. In a preferred embodiment, this atom ratio is about 0.01:1.

The non-metallic additive may be selected from any non-metallic element or combination of elements, but generally is one or more of carbon, nitrogen, phosphorus, oxygen and sulfur. When oxygen atoms are present in the composite, the presence of carbon, nitrogen and/or phosphorus is generally preferred. The preferred embodiments are typically substantially silicon free.

Typically, the bulk resistive layer contains at least about 0.001 atom of one or more non-conductive additives per atom of normally conductive metal i.e., 1 atom of non-conductive additive to 1,000 atoms of metal. Generally, the bulk resistive layer contains at least 80 weight percent normally conductive metal atoms (relative to the total number of atoms in the bulk resistive layer).

The preferred resistive layers may be further characterized as having a bulk resistivity greater than about 600 $\mu\Omega$.cm (micro-ohm.centimeters), as being plateable from aqueous solution to reproducibly yield an adherent deposit which is capable of being bonded to an insulative support without loss of physical integrity, as being non-radioactive, as having a melting point and crystallographic phase transitions, if any, at temperatures greater than about 450° F., as having a temperature coefficient of resistivity less than about 300 ppm/° C. in the temperature range of from about 20° C. to about 100° C. when properly deposited, as having current versus voltage characteristics typical of presently available resistors, and as having sufficient chemical resistance to withstand normal use conditions when properly protected by passivation, anodization, overplating or coating with an organic or inorganic layer.

The resistive layer of the invention may be deposited from an aqueous electroplating bath onto a conductive foil, such as a stabilized copper foil layer.

The resistive layer of the invention may be utilized with any conductive foil known to those skilled in the printed circuit board industry. Examples include copper foil, nickel foil, etc. For example, the resistive layer may be electrodeposited upon either treated or untreated copper foils. Typically, the resistive layer is applied to the matte side of an electrodeposited conductive foil. For practical reasons, the copper foil is generally a plain electrodeposited copper foil which has been treated (stabilized) to prevent oxidation and which has otherwise been left untreated. But it is recognized that in some instances it might be more desirable to apply the resistive layer to an untreated copper foil or one which has been fully bond-treated.

Other conductive foils which might find application in connection with the present invention include rolled copper and electrodeposited nickel foils, for example.

It is advantageous, although not necessary, at this point, to heat the thus prepared double layer foil at an elevated temperature in air or in a controlled atmosphere. The double layer foil then is ready to be laminated with its resistive layer against an insulative layer such as one or more plies of a fiberglass fabric pre-impregnated with an appropriate formulation of curable organic resins. The multiple layer foil and the pre-impregnated fiberglass fabric (prepreg) are then bonded together utilizing conventional procedures such as pressing at 250 to 750 psi and 350° to 450° F. for 40 minutes to 2 hours to obtain a laminate which consists of an insulative layer, an electrodeposited electrically resistive layer bound to the insulative layer and an outer conductive layer adhered to the resistive layer.

It is also recognized by the inventors that the insulative layer need not necessarily be a prepreg. In this regard, a multiple layer foil which includes the resistive layer, such as the multiple layer foil 14 shown in FIGS. 1 and 2, may be bonded to an adhesive coated polyester film. Using a lamination temperature of 300° F., pressures ranging from 40 to 300 psi and press times ranging from 10 to 90 seconds, laminates having peel strengths greater than 9.5 pounds per inch may be produced using a polyester film insulative layer.

The invention has application irrespective of the manner in which the resistive layer and the conductive layer are attached to one another. In a preferred form of the invention, the resistive layer is electrodeposited directly onto a matte surface of the conductive layer. Thus, the invention provides a novel printed circuit board material in the form of layered stock comprising at least one layer of an electrically resistive material adhered to and in intimate contact with a layer of a highly conductive material.

Figure 2:
FIG. 2 is a cross-sectional view taken along the line 2—2 of FIG. 1 to show the structural details of the laminate.

A multiple layer laminate such as the laminate 10 of FIGS. 1 and 2 having a resistive layer 16, may be used to prepare a printed circuit board. Using conventional procedures, a conductive line defining photoresist may be applied to the upper surface of the conductive layer 18 of the laminate 10. The photoresist may then be exposed in a conventional manner to a selected pattern of ultraviolet light, which is generally provided by a photographic negative containing the negative image of the combined resistor an conductor pattern. The photoresist is then developed by removal of unexposed areas of the resist film. What remains is a patterned photoresist layer (i.e., a conductive line mask), which leaves portions of the conductive foil layer 18 uncovered while other portions remain covered by the mask (the term "mask" is defined in this application as the cured (i.e., patterned) photoresist layer).

The masked laminate 10 is then treated so as to expose the multiple foil layer 14 to a preferential etchant capable of preferentially etching the conductor layer relative to the resistive layer. Such etchants may include an alkaline ammoniacal etchant, ferric or cupric chloride (acidified with hydrochloric acid), hydrogen peroxide, chromic acid or other suitable etchant, such as when the foil layer comprises a major amount of copper. Except for ammoniacal etchants and chromic acid etchants, the same types of etchants may also be used to preferentially etch foil comprising a major amount of nickel.

Etchants such as cupric chloride ($CuCl_2$)/hydrochloric acid (HCl) etchant, are often used. In one embodiment, the etch bath may contain, for example, 200 grams per liter of cupric chloride and 127 ml per liter of concentrated hydrochloric acid. The etch bath may be maintained at a temperature of about 52° C. The etchant etches the copper foil 18 in those areas which are not covered by the conductive line mask.

The above steps of masking and etching are generally followed by rinsing the laminate with water. The result is the removal of the foil layer 18 from areas which are not covered by the mask of developed photoresist.

Figure 3:
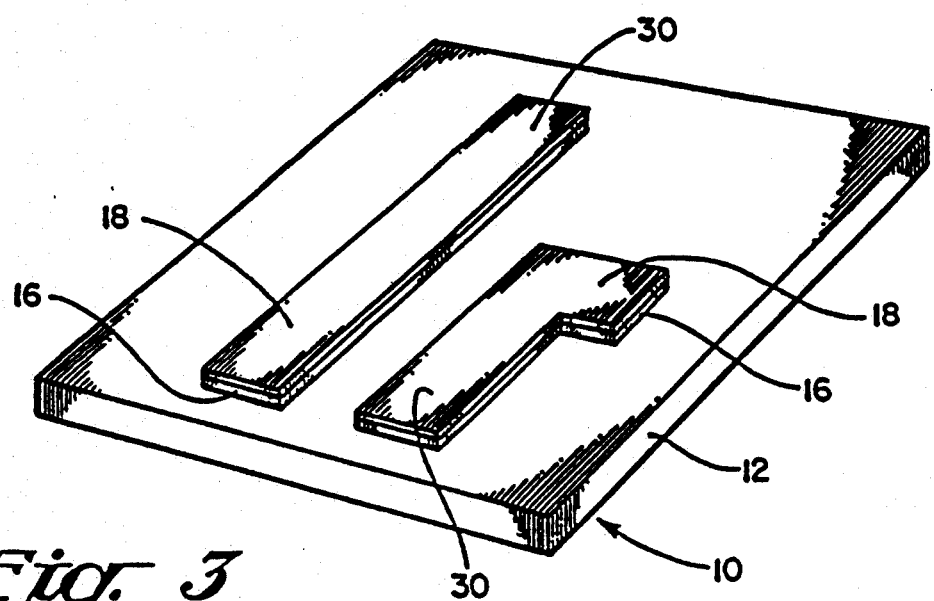
FIG. 3 is a perspective view of the laminate of FIG. 1 after a first etching step.

The exposed underlying resistive layer may be removed by contacting the exposed portions of the resistive layer of laminate 10 with a second etchant capable of etching the resistive layer. When the resistive layer contains a major amount of chromium, an 18% (by weight) hydrochloric acid solution at a temperature of about 50° C. or greater may be used as the resistive layer etchant. In one preferred embodiment, the laminate 10 is immersed in the hydrochloric acid solution for about 10 seconds to complete removal of the chromium-containing resistive layer 16. The remaining cured photoresist (i.e., the conductive line masking photoresist) may then be removed (i.e., stripped off) from the foil areas to which it had been adhered. A pattern of conductive lines 30, as may best be seen in FIG. 3, is left behind. Each of the conductive lines 30 has an outer layer of conductive foil 18 and an underlying layer 16 of resistive chromium affixed to the substrate 12.

In order to define one or more planar resistors, a resistive line defining layer of a photoresist may be applied to the pattern of conductive lines illustrated in FIG. 3. Again, a photoresist pattern may be defined by exposing the photoresist to a pattern of ultraviolet light, such as exposing the photoresist through a photographic negative, and the unexposed portions of photoresist removed (generally by washing it away), all in a conventional manner. Portions of the resistive line photoresist (i.e., the developed image) remain behind to mask the conductive lines 30 or portions thereof which are to remain on the substrate 12. The foil layer 18 may then be removed at portions thereof which are not covered by the resistive line mask by immersing the laminate 10 in, or contacting the foil 18 with the etchants described above for removing foil. At this point, the conductive and resistive areas are defined and are each in appropriate contact, one with the other, to obtain a printed circuit board having a planar resistor.

In other words, the printed circuit board may include means for electrically coupling an electrical potential to the resistive line. The electrically coupling means may, for example, comprise a pair of spaced copper pads adhered to the resistive line. The resistive line and the spaced copper pads may be created by etching respective electrodeposited layers. For example, the resistive line mask described above may be removed to obtain the printed circuit board illustrated in FIG. 4, which consists of a resistive line 40 comprised of a portion of the original resistive layer 16, such as a chromium-containing resistive layer, together with means for electrically coupling an electrical potential to the resistive line 40 comprising a pair of conductive copper foil end contact pads 42 and 44 which are in intimate electrical contact with the resistive line 40. As would be well known to one skilled in the printed circuit board art, the pads 42 and 44 provide means for coupling the resistive line 40 to an electrical potential.

Respective pluralities of resistive line planar resistors may be arranged in networks and interconnected by appropriate conductors to provide a variety of resistances and resistance characteristics. The printed circuit board of FIG. 4 may also have one or more conductive foil lines 30 remaining thereon to conduct electricity in a conventional manner.

In accordance with the invention, the sheet resistances of resistive layers or lines may be deliberately altered by changing the amount of non-conductive additive electrodeposited therewith by varying the electroplating conditions or the chemistry of the plating bath.

In another embodiment, the multiple layer foil produced by electrodepositing a nickel-containing resistive layer on a copper conductive layer may be utilized to prepare a laminate for subsequent use in preparing a printed circuit board. With reference to FIGS. 1 and 2, the layer 16 is, according to the above example, a nickel-containing layer rather than the chromium-containing layer described above. In all other respects the laminate 10 may be essentially the same as has been described above. Thus, the laminate 10 is made up of a multiple layer foil 14 which comprises an electrodeposited resistive nickel layer 16 bonded or laminated to the substrate 12 and a conductive copper foil layer 18 suitable for preparing printed circuits. In a preferred embodiment, prior to use as the cathodic substrate in the plating bath, the conductive foil 18 is stabilized so as to improve its resistance to oxidation.

The laminate 10 may be produced by applying temperature and pressure as set forth above. The resultant laminate may be subjected to etching to prepare a printed circuit board. A photoresist may be applied as described above and exposed to a selected pattern of ultraviolet light. What remains after suitable development is a patterned photoresist layer or conductive line mask which covers portions of the conductive copper foil layer 18 and leaves other portions uncovered. The multiple foil layer 14 of the laminate 10 may then be exposed to an etchant capable of etching both the copper foil and nickel-containing resistive layer such as a ferric or cupric chloride acidified with hydrochloric acid and hydrogen peroxide. The cupric chloride/hydrochloric acid etchant described above is often preferred. The etch bath may, for example, contain 200 grams per liter of cupric chloride and 127 ml per liter of concentrated hydrochloric acid. The etch bath may preferably be maintained at a temperature of about 52° C. When the resistive layer is a nickel.sulfur layer, such an etch bath removes the copper foil 18 and the nickel.-sulfur layer 16 at those areas which are not covered by the photoresist mask.

When the laminate is processed as set forth above, an unidentified residue may remain on the substrate 12. This residue may be removed by contacting the laminate having the mask thereon with a second etchant comprising chromic acid and sulfuric acid to remove the residue from all unmasked portions of the insulative layer. In one embodiment, the residue may be removed by using a residue stripping etchant made up of 300 grams per liter of chromic acid and 30 ml per liter of concentrated sulfuric acid. This bath may be maintained at a temperature of 45° C. and the stripping is generally achieved in about 15 seconds. The remaining photoresist is then removed from the copper foil 18 and a pattern of conductive lines 30 as illustrated in FIG. 3 remains. Each of the conductive lines 30 has an outer layer of the conductive copper foil 18 and an underlying layer of the resistive nickel layer 16 affixed to the substrate 12.

In order to define one or more planar resistors, a resistive line defining layer of a photopolymer film resist may be applied to the multiple layer printed laminate or circuit board 10. A second photoresist pattern may be defined by exposing the photoresist to an ultraviolet light pattern and the photoresist may then be suitably developed. Undeveloped portions of the resistive line photoresist are removed and the remaining portions present a resistive line mask covering the conductive lines 30 or portions thereof which are to remain on the substrate 12. Other portions of the conductive lines 30 are not covered by the resistive line mask. The exposed portions of the copper foil layer 18 of the lines 30 may then be removed by contacting the copper layer 18 with a preferential etchant such as one comprised of an aqueous solution containing 300 grams per liter of chromic acid and 30 ml per liter of concentrated sulfuric acid or an ammoniacal etchant. At a temperature of 45° C., the chromic acid/sulfuric acid or ammoniacal preferential etchant generally will not attack the resistive nickel-containing layer 16.

Figure 4:
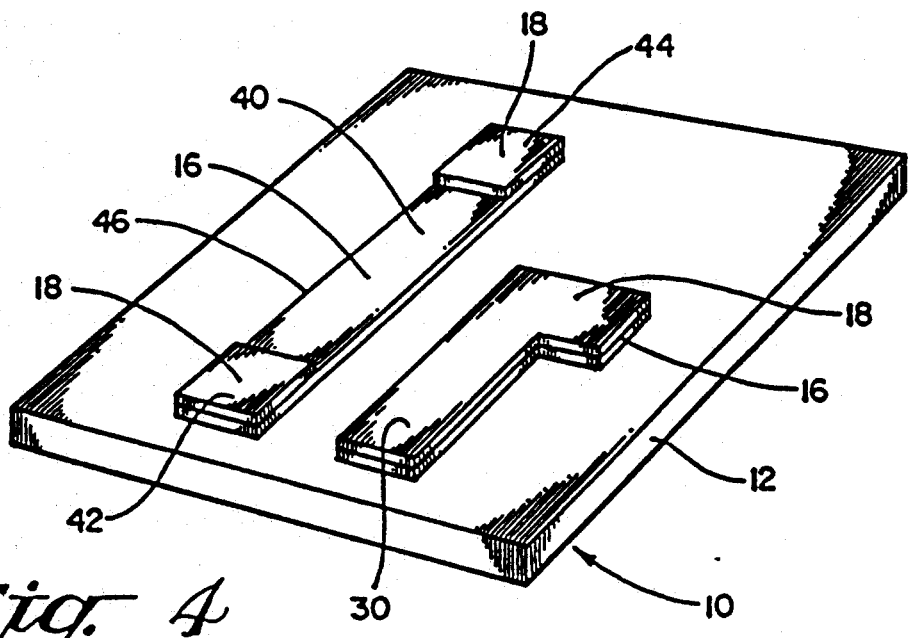
FIG. 4 is a perspective view of a printed circuit board prepared from the laminate of FIG. 1 and which includes a resistive line and spaced copper pads providing means for electrically coupling an electrical potential to the line.

Upon removal of the resistive line mask, a printed circuit board is obtained which has a resistive line 40 comprised of the nickel-containing composite and means for electrically coupling a potential to the nickel-containing resistive line 40 comprising a pair of conductive copper foil end contact pads 42 and 44 which are in intimate electrical connection with the resistive line, as can best be seen in FIG. 4. The printed circuit board may also have one or more of the conductive foil lines 30 remaining thereon to conduct electricity in a conventional fashion and/or a plurality of resistive lines 40 arranged in an appropriate network.

Various materials are known today from which printed circuit board components may be prepared. In general a printed circuit board material (or PCB precursor) consists of an insulating support and outer layers of a highly conductive material on one or both of the exterior surfaces of the support. The method of converting the precursor material into a desired product involves the selective removal of unwanted portions of the conductive layers to leave behind conductive areas of a desired configuration. The invention described herein pertains to the provision of an electrically resistive material (planar resistor) to be utilized in conjunction with a highly conductive layer. The highly conductive layer with the electrical resistance material physically adhered thereto may then be used for the production of printed circuit boards which include resistors as well as conductors. The methods for the selective removal of unwanted areas from the highly conductive layer with the electrical resistance material physically adhered thereto are essentially the same as the methods that have been utilized for removing unwanted areas of conductive layers which are not joined to a resistive layer.

While the foregoing generally describes the methods for preparing printed circuit board components from laminates, such as the laminates of the present invention, other procedures may be required, depending on the characteristics of the particular layers to be etched away. For example, etching with two different etch formulations may be necessary to achieve a single removal step due to the formation of a residue resulting from application of a first etchant.

The resistive layers of the invention are electrodeposited layers of a composite of a normally conductive metal component and a resistance increasing amount of a non-metallic additive. One of the novel aspects of the invention is based on the fact that the non-metallic additive comes from a source which initially is an ingredient of the plating bath. Thus, in addition to the other normal ingredients of the bath, the bath includes a source of the normally conductive metal component of the resistive layer and a source of a non-metallic resistance increasing additive. The source of the non-metallic additive generally will be a compound that is soluble in the aqueous medium of the bath and which is not decomposed by the other ingredients of the bath. On the other hand, the source should generally be subject to decomposition upon application of the electroplating current to the plating bath. Upon decomposition of the source, the carbon, nitrogen, phosphorus, oxygen and/or sulfur species are released from the source and incorporated into the electrodeposited mass.

The inventors have discovered that organic acids and ionizable salts thereof are useful as sources of carbon and oxygen for the purposes of the present invention. In particular, acids such as formic acid, acetic acid and propionic acid and the alkali metal salts thereof have been found to be effective. A preferred source for carbon and oxygen is propionic acid.

Nitrogen-containing compounds such as thiourea, urea, amino acids, water-soluble proteins (such as gelatin), quaternary amines (such as tetralkylammonium salts), nitric acid, etc., and ionizable salts thereof, may be used as sources of nitrogen and oxygen for the present invention. Water soluble or dispersable organic compounds having nitrogen-containing groups, such as amine, nitrate and nitrile groups, may be used as sources of nitrogen and carbon and/or oxygen.

Phosphorus-containing compounds such as ortho- and pyrophosphoric acids; meta-, ortho- and pyrophosphorous acids; and numerous organophosphosphorous compounds, such as aminotrimethylene phosphonic acid (ATMP), etc.; and ionizable salts thereof, may be used as sources of phosphorus and oxygen. Many other water-soluble or dispersable organic compounds having phosphorus-containing groups, such as phosphate groups, or phosphate esters, may be used as sources of phosphorus and carbon and/or oxygen.

A bath-soluble sulfur-containing compound, such as a thiosulfate or thiourea salt, may be used to provide sulfur. Sodium thiosulfate, for example, has been found to be a particularly effective and preferred source of sulfur when the latter element is to be used as a non-metallic resistance increasing additive.

Various combinations of elements can be provided either by admixing the respective sources mentioned above or by using, as a source, a compound which has the desired elements as part of its composition. Bath soluble or dispersable organic compounds with amine nitrate, phosphate and/or carboxylic acid groups may also be used as a source of nitrogen, phosphorus, carbon and oxygen atoms, respectively. A bath soluble or dispersable organic compound having one or more carboxylic groups and one or more nitrogen-containing groups may be used as a source of carbon, nitrogen and oxygen, for example.

The source of the normally conductive metal is generally the same as that which would be used for conventional plating baths known in the art.

The source of chromium, for example, may be chromium trioxide and trivalent chrome stabilized in solution by one or more complexing agents known in the art, etc. The complexing agents may include, for example, aspartic acid, amino diacetic acid, nitrilo triacetic acid, 5-sulfosalicylic acid, citric acid, or a mixture of formate and glycine (1:1 molar ratio). Trivalent chromium-containing baths are described in detail in U.S. Pat. No. 4,448,648, which is hereby fully incorporated herein by reference.

The source of nickel may be an ionizable salt of nickel, typically nickel sulfate, nickel acetate, etc.

The source of cobalt may be an ionizable salt of cobalt, such as cobalt sulfate, cobalt acetate, etc.

The source of vanadium may be an ionizable salt of vanadium such as vanadyl sulfate trihydrate or sodium metavanadate or, preferably, an oxide such as vanadium pentoxide, etc.

The source of tungsten may be an ionizable salt of tungsten such as sodium tungstate, or preferably, tungstic acid, etc.

The source of molybdenum may be an ionizable salt of molybdenum such as sodium molybdate or, preferably, molybdic acid, etc.

It is well within the level of skill in the art for the ordinary artisan to select appropriate sources for these and other conductive metals to be added to the plating baths of the present invention. Suitable sources generally are acids and ionizable salts of the respective metals. The anion of the ionizable salts is generally one of the anions already present in the bath as a catalyst or as a source for a non-conductive additive.

The above metals may be combined in single bath formulations to obtain properties not obtainable with any of the above metals taken individually. Examples include combining a source of chromium with a source of one or more of nickel, cobalt, vanadium, titanium, etc., (see conductive metals described above) and combining any of these conductive metal sources with a source of molybdenum or tungsten.

One of the preferred resistive materials of the invention comprises a composite containing chromium, or chromium combined with tungsten and/or molybdenum as the normally conductive metal component, and carbon and oxygen as the non-metallic additive. As mentioned above, it has been discovered that the presence of molybdenum and/or tungsten generally improves the power handling capability of the resistive layer. A resistive layer containing a preferred atom ratio of molybdenum or tungsten to other metals can be obtained, for example, by incorporating about 100 grams per liter molybdic acid or about 200 grams per liter tungstic acid into a plating bath prepared according to the present invention.

The non-metallic additive is distributed throughout the composite. The distribution of the non-metallic additive is substantially uniform throughout the bulk of the resistive layer. X-ray diffraction patterns obtained for the chromium.carbon.oxygen resistive layer, for example, show that the composite comprises a minor phase of a simple cubic crystal lattice structure, and a major phase of a body centered cubic (bcc) crystal lattice structure, whereas the simple cubic phase is not detectable in the X-ray diffraction pattern of chromium electrodeposited without the non-metallic additive.

The resistance of the resistive layer is related to the concentration of the non-metallic additive in the composite. To achieve resistance (or resistivity) in a range preferred for use in printed circuit boards and similar applications, it is preferred, though not required, that the average ratio of the total number of carbon, nitrogen, and phosphorus atoms to the total number of normally conductive metal atoms be at least about 0.001:1, i.e., 1:1000, resistive layer. It is also preferred, though not required, that the average ratio of the total number of oxygen and sulfur atoms to the total number of normally conductive metal atoms be at least about 0.01:1, i.e., 1:100, of the resistive layer. A preferred concentration of normally conductive metal in the bulk of the resistive composite is at least about 80 weight percent. It is especially preferred that the resistive layer contain at least about 80 weight percent chromium.

In one embodiment, the resistive layer contains at least about 0.02 weight percent carbon, nitrogen and/or phosphorus. The same embodiment might also contain at least about 0.4 weight percent oxygen and/or sulfur.

In one embodiment having a sheet resistance of 25 Ω per square, for example, the bulk of the resistive layer contains a ratio of 0.028 atoms of carbon and 0.15 atoms of oxygen per atom of chromium and a chromium concentration of about 90 weight percent (as determined by one of the techniques for determining elemental concentration in the bulk of the composite set forth below).

The bulk of the resistive layer is that portion of the resistive layer in which the composition is substantially uniform (i.e., that portion which is substantially unaffected by surface contamination). That portion generally begins less than approximately 50 angstroms below the surface of the resistive foil when the resistive foil is on the matte side of a low profile copper foil and generally less than about 20 below the surface angstroms when plated on a smooth conductive surface.

One technique for measuring the concentration of the metallic and non-metallic atoms in the bulk resistive composite is to electrodeposit a sufficient quantity of resistor layer on a conductive surface to permit chemical analysis by conventional analytical techniques.

One approach is to prepare a sample of the resistive layer produced by electrodeposition for a period of time substantially longer than the time required to produce the resistive layer to be used for electronic applications, so that the effect of surface contamination is reduced to a fraction of the total concentration. Preferably, that fraction is less than the typical margin of error in chemical composition analysis.

Another approach to obtaining sufficient quantity of sample is to electrodeposit the resistive layer onto a large surface area of conductive material.

After electrodeposition, the conductive material is dissolved from the resistive layer, such as by immersing the deposited resistive layer into a solution which is capable of dissolving the conductive material and not the resistive layer. When the conductive material is a copper foil, an example of such a solution is the copper etchant described below in connection with preferential etching of copper in the preparation of printed circuit boards. The remaining resistive layer may be analyzed by atomic absorption spectroscopy to determine metal content and another sample of the same material may undergo destructive testing to analyze for the non-metal additives. Carbon, nitrogen and oxygen concentrations, for example, may be determined by conventional techniques which involve combustion of a sample of the aforementioned resistive layer followed by infrared detection of the combustion products. Phosphorus content may be determined by standard wet chemistry techniques. The atom ratios may be calculated from the weight percent determination obtained for each element.

Other types of analysis, such as electron spectroscopy chemical analysis (ESCA), which relies on photoelectron spectroscopy, and scanning Auger spectroscopy, have met with limited success in determining the composition of the bulk material when the bulk material is on the matte side of copper foil due to the impurities introduced to the surface being scanned when the outermost surface is removed by sputtering. Therefore, the weight percent concentrations and ratios set forth in this application are based primarily on the bulk chemical composition analysis techniques outlined above.

In one embodiment, the electroplating bath for preparing a resistive layer from such a material contains from about 25 to about 450 grams, preferably from about 100 to about 360 grams, and more preferably from about 200 to about 360 grams, per liter of a chromium source, such as chromic acid anhydride, from about 0.1 to about 2.35 grams per liter of sulfuric acid, from 0 to about 50 grams per liter of an oxy-halo acid anion and from about 20 to about 300 grams per liter of an organic, preferably aliphatic, acid. The quantity of the organic acid needs to be sufficient to achieve the objective of the invention which is to provide a sufficient amount of carbon and/or oxygen additive in the resistive layer to produce the desired resistivity.

Resistivity varies with the amount of the additive (as discussed above). Thus, resistivity is generally reduced when the amount of the additive incorporated into the electrodeposited resistive layer is decreased. The amount of the additive in the electrodeposited resistive layer varies with the amount of the source thereof which is originally dissolved in the bath. For example, the sheet resistance of the deposited resistive layer comprising carbon and oxygen will vary with the amount of the organic acid in the electroplating bath (other conditions being equal). Due to the nature of the electroplating operation, the variance is not always direct and the exact relationship between the amount of the source acid in the bath and the resistivity of the electroplated resistive layer is generally determined empirically.

The temperature of the plating bath may generally be maintained in the range of from about 5° to about 50° C. during the electroplating operation. The current density is generally in the range from about 50 amperes per square foot up to the maximum density obtainable with the equipment at hand. In this regard, the maximum current density is limited only by criteria which are well known to those of ordinary skill in the electroplating art.

The plating bath provided by the invention may include a substance which in this invention acts as a catalyst. In one aspect of the invention, the catalyst may comprise oxy-halo anions such as periodate, iodate, perbromate, bromate, perchlorate or chlorate ions. The catalyst may also include sulfate ions. The presence of a catalyst is preferred for mass production of resistive layers having uniform and predictable sheet resistance or resistivity.

Oxy-halo acid anions are the primary catalyst which may be used in the electroplating bath to promote deposition of chromium. A synergistic effect is seen when oxy-halo ions are used in combination with sulfuric acid. Chlorate, bromate and iodate ions have been found to be effective and in this regard the iodate is more effective than the bromate, which, in turn is more effective than the chlorate. Peroxy-halo ions such as periodate, perbromate and perchlorate are also effective for the purposes of the invention. Preferably the oxy-halo acid anion may be provided by using the sodium or potassium salt of chloric acid, that is either sodium or potassium chlorate, the main reason being the relative low cost and ease of availability of these materials. Functionally, oxy-halo acid anions are powerful oxidizers and similar catalytic effects have been noted with other powerful oxidizers, for example, the permanganate ion. The latter anion is not completely satisfactory, however, in that it tends to be source of manganese which ends up in the electrodeposited layer and changes its character.

Sulfuric acid may be used as a source of sulfate anion, a known catalyst for the deposition of many normally conductive metals including those used in making the resistive layer of the present invention. The deposition of chrome, for example, is catalyzed by this anion.

As set forth above, the source of non-conductive additive in the electroplating bath provides non-conductive additive for the resultant resistive layer. An organic acid, for example, releases oxygen and carbon atoms from the acid upon decomposition as a result of the application of current, which end up in the lattice of the deposited layer to thereby decrease the conductivity (i.e., increase the resistivity) thereof The impurities and defects in the crystal lattice of the resistive material may have the effect of decreasing the conductivity relative to that of the pure bulk material. In accordance with the invention, the resistive layer has an intrinsically lower conductivity (or higher sheet resistance) than the metal component itself would have. The exact nature and/or form of the additive in the composite material is not completely understood and it could be that the additive in the composite is present in elemental form or as a compound. However, the inventors so not wish to be bound by any particular theory of how the invention achieves the desired objectives.

In this regard, the resistive composite materials of the invention contain two components, (i.e., the metallic component and the non-metallic additive) and the resultant electrodeposited composite may be in the form of a solid solution, pure elements, interelemental compounds and/or mixtures thereof. The resistive layers produced in accordance with the invention need only be of sufficient thickness to be dimensionally stable during storage and further processing and utilization as a printed circuit board component. In general, the resistive layers of the invention have thicknesses in the range of from about 0.1 to about 0.4 microns ($\mu$). However, electrodeposited layers and the like have rough surfaces such that specific numbers for thickness are actually average thicknesses. An objective is to provide a material which preferably has a bulk resistivity greater than about 600 $\mu\Omega$.cm and which is electrodeposited in a layer having a thickness of about 0.1 to about 0.4 $\mu$ so as to provide sheet resistances in the range of from about 15 to about 1000 $\Omega$ per square, such as about 25 $\Omega$ per square.

The material produced in accordance with the invention may be referred to as a composite of the metallic and the non-metallic components and the same is not necessarily an alloy or a dispersion. However, the latter phases or states are possibly achieved. Because of the dimensional and physical characteristics of the resistive layer, it is somewhat difficult to determine the exact chemistry thereof or even the exact ratio of the ingredients therein. Accordingly, the desired resistivity characteristics are generally obtained empirically by varying the amounts of the components in the electroplating bath and measuring the resistance of the resultant electrodeposited layer until the desired resistance is achieved.

Proper control of process parameters, including solution temperature, current density, plating time and agitation is necessary in order to achieve high deposition efficiency. In this connection, temperatures below about 23° C. and above about 34° C. have generally been found to have an adverse affect on efficiency. The optimum temperature of the bath is generally in the range from about 25° to about 35° C. The current density is the measure of the total rate of the reactions taking place at the electrodes. Use of excessively high or low current densities is undesirable. High currents result in heating which makes process control more difficult. With low currents the deposition is less efficient due to hydrogen evolution. Optimum current densities generally fall in the range from about 75 to about 300 amperes per square foot (ASF) and differ from one bath formulation to another. Plating time is directly related to the thickness of the deposit. Longer plating times generally produce thicker deposits and therefor lower sheet resistances, while shorter plating times generally provide higher sheet resistances. The agitation of the bath during the electrodeposition process enhances mass transfer to raise the limits of operable currents and improve deposition efficiency.

In accordance with the invention, it is desirable that the electrodeposited resistive layer be as uniform as possible. In beaker cells with stationary electrodes, deposition efficiency and uniformity are sensitive to electrode configuration. Horizontal cells work well while the conventional vertical cells tend to yield poor uniformity. With regard to electrode gap, larger gaps lead to higher solution resistance, resulting in higher electric power consumption, but contribute to better current distribution and therefore better deposit uniformity. In a 5 inch by 5 inch horizontal cell used in accordance with the present invention, a 2 inch gap has been extensively tested with good results.

Uniformity of the electrodeposited resistive layer is related to the roughness of the substrate upon which the deposit is made. In order to achieve good uniformity, substrates with a lesser degree of roughness are more desirable. The use of substrates with a lesser degree of roughness, however, may result in a double layer foil which has an insufficient peel strength. Thus, a compromise between uniformity and peel strength is necessary in the selection of the substrate.

All of the constituents of the bath must work in a harmonious fashion. For example, the chromium resistive material may be produced from a bath which contains only an organic acid, a chromium source such as chromic anhydride and sulfate ions. The chromium resistive material may also be produced from baths which contain only oxy-halo anions, a chromium source such as chromic anhydride and sulfuric acid, or baths containing only oxy-halo anions, a chromium source such as chromic anhydride and the organic acid. The use of oxy-halo anions allows the bath to be more tolerant of increased sulfate levels. For example, when no oxy-halo anions are present, poor results are obtained when sulfate ions are present in excess of 0.5 grams per liter. When oxy-halo anions are present, however, sulfate ion levels in excess of 2.0 grams per liter still provide a very high efficiency for the deposition process.

Of course, when operating the bath at high levels of oxy-halo anions, it must be recognized that the formation of explosive oxides of the halogens may be encountered. For this reason it is suggested that the oxy-halo anion levels should not be allowed to exceed 7 or 8 grams per liter.

As described above, the sheet resistance of a resistor layer varies with the concentration of the normally conductive metal source, such as chromic acid anhydride, and catalysts, such as the sulfuric acid in the bath. Sheet resistance also varies with solution temperature and current density during the electroplating operation. These effects are illustrated in the following Tables 1 through 5 which set forth results of tests conducted in systems containing chromic acid anhydride, sulfuric acid and acetic acid. The effects of individually varying the concentrations of chromic acid, acetic acid and sulfuric acid are illustrated in Tables 1, 2 and 3, respectively.

TABLE 1

EFFECT OF VARYING CHROMIC ACID IN ELECTROPLATING BATH ON RESISTANCE OF CHROME RESISTOR LAYER

| Solution Chemistry - | $CrO_3$: | Varying |
| --- | --- | --- |
| | Acetic Acid: | 200 g/l |
| | $H_2SO_4$: | 250 ppm |
| Solution Temperature: | 27.5° C. | |

| $CrO_3$ (g/l) | C.D.* × Time | Sheet Resistance (Ohm/Sq)*** |
| --- | --- | --- |
| 200 | 300 ASF** × 120 Sec. | 76.0 |
| 225 | 300 ASF** × 120 Sec. | 50.5 |
| 250 | 300 ASF** × 120 Sec. | 58.6 |
| 275 | 300 ASF** × 120 Sec. | 45.7 |
| 300 | 300 ASF** × 120 Sec. | 51.9 |
| 200 | 300 ASF × 140 Sec. | 43.9 |
| 225 | 300 ASF × 140 Sec. | 46.3 |
| 250 | 300 ASF × 140 Sec. | 37.4 |
| 275 | 300 ASF × 140 Sec. | 24.9 |
| 300 | 300 ASF × 140 Sec. | 37.1 |

*C.D. = current density
**ASF = Amperes per square foot
***As used throughout this application, the term "sheet resistance" is defined as the resistance to the flow of electrons in a true thin film resistor expressed in units of "ohms per square". The value of "ohms per square" is a constant regardless of the size of the square, because the thickness of the resistor (h) in the formula R = p (L/w × h) (in which R is resistance, p is resistivity, L is length of the resistor and w is width) is considered to be constant. This is explained in more detail in "Printed Wiring Design Guide", Section 2.3.2.4, Appendix (Institute for Interconnecting and Packaging Electronic Circuits, 1/73).

TABLE 2

EFFECT OF VARYING ACETIC ACID IN ELECTROPLATING BATH ON RESISTANCE OF CHROME RESISTOR LAYER

| Solution Chemistry - | $CrO_3$: | 275 g/l |
| --- | --- | --- |
| | Acetic Acid: | Varying |
| | $H_2SO_4$: | 220 ppm |
| Solution Temperature: | 30° C. | |

| Acetic Acid (g/l) | C.D. × Time | Sheet Resistance (Ohm/Sq) |
| --- | --- | --- |
| 100 | 300 ASF × 135 Sec. | 35.2 |
| 110 | 300 ASF × 135 Sec. | 33.3 |
| 120 | 300 ASF × 135 Sec. | 29.6 |
| 130 | 300 ASF × 135 Sec. | 29.3 |
| 140 | 300 ASF × 135 Sec. | 17.6 |
| 150 | 300 ASF × 135 Sec. | 15.8 |
| 160 | 300 ASF × 135 Sec. | 18.7 |
| 170 | 300 ASF × 135 Sec. | 18.6 |
| 180 | 300 ASF × 135 Sec. | 22.4 |
| 190 | 300 ASF × 135 Sec. | 20.8 |
| 200 | 300 ASF × 135 Sec. | 22.4 |
| 210 | 300 ASF × 135 Sec. | 26.8 |

TABLE 2-continued
EFFECT OF VARYING ACETIC ACID IN
ELECTROPLATING BATH ON RESISTANCE OF
CHROME RESISTOR LAYER Solution Chemistry -  $CrO_3$: 275 g/l
Acetic Acid: Varying
$H_2SO_4$: 220 ppm
Solution Temperature: 30° C.

| Acetic Acid (g/l) | C.D. × Time | Sheet Resistance (Ohm/Sq) |
|---|---|---|
| 220 | 300 ASF × 135 Sec. | 43.5 |
| 230 | 300 ASF × 135 Sec. | 42.3 |

TABLE 3
EFFECT OF VARYING $H_2SO_4$ IN ELECTROPLATING
BATH ON RESISTANCE OF CHROME RESISTOR LAYER

Solution Chemistry -  $CrO_3$: 247.5 g/l
Acetic Acid: 211.5 g/l
$H_2SO_4$: Varying
Solution Temperature: 28° C.

| $H_2SO_4$ (ppm) | C.D. × Time | Sheet Resistance (Ohm/Sq) | Chrome Deposit (mg/dm$^2$)* |
|---|---|---|---|
| 0 | 300 ASF × 160 Sec. | 54.9 | 12.0 |
| 75 | 300 ASF × 150 Sec. | 52.5 | 14.1 |
| 100 | 300 ASF × 150 Sec. | 35.5 | 16.2 |
| 150 | 300 ASF × 150 Sec. | 29.4 | 20.0 |
| 200 | 300 ASF × 150 Sec. | 25.1 | 19.4 |
| 250 | 300 ASF × 150 Sec. | 26.4 | 19.4 |
| 300 | 300 ASF × 150 Sec. | 34.0 | 19.7 |
| 400 | 300 ASF × 150 Sec. | 78.5 | 18.3 |
| 500 | 300 ASF × 150 Sec. | 152. | 16.0 |

*mg/dm$^2$ = milligrams per square decimeter

Of the three solution ingredients in Tables 1, 2, and 3, the sheet resistance of the electroplated layer is most sensitive to sulfuric acid concentration. Increasing the amount of sulfuric acid causes sheet resistance to decrease initially and to then increase after passing a region of minimum resistance, as shown in Table 3.

Also shown in Table 3 are the accompanying changes in the total quantity of chromium deposited per square decimeter of chromium resistive layer. This data indicates that decreases in sheet resistance are accompanied by increases in milligrams of Cr per square decimeter of resistive layer (mg/dm$^2$), and vice versa. The mg/dm$^2$ is generally highest in the layer having the lowest resistance, thus providing an indication of the point where deposition efficiency is higher. From Table 3 it can therefore be seen that the highest deposition efficiency occurs at the point where the sulfuric acid concentration is in the range from about 200 to about 250 ppm.

The sheet resistance of the electrodeposited resistive layer is not as sensitive to variation of the concentrations of the other ingredients. However, the effects of varying the concentrations of these ingredients are similar to the sulfuric acid effects in that a condition may be identified where sheet resistance is at its minimal level, and this occurs at about 275 grams per liter for the chromic acid and between about 140 and 170 grams per liter for the acetic acid.

Table 4 set forth below illustrates the fact that the preferred solution temperature range is from about 28° to about 33° C. Sheet resistances tend to be higher at temperatures below and above the preferred range. This Table indicates that temperatures in the range of from about 28° to 48° C. can be employed to produce a desired sheet resistance simply by adjusting the plating times.

TABLE 4
EFFECT OF VARYING ELEOTROPLATING
BATH TEMPERATURE ON RESISTANCE OF
CHROME RESISTOR LAYER

| Solution | $CrO_3$(g/l) | Acetic Acid (g/l) | $H_2SO_4$ (ppm) |
|---|---|---|---|
| 1 | 247.5 | 211 | 200 |
| 2 | 272 | 200 | 236 |

| Solution Temp. (°C.) | Solution | C.D. × Time | Sheet Resistance (Ohm/Sq) |
|---|---|---|---|
| 28 | 1 | 300 ASF × 160 Sec. | 54.9 |
| 38 | 1 | 300 ASF × 160 Sec. | 49.7 |
| 48 | 1 | 300 ASF × 160 Sec. | 135. |
| 21.5 | 2 | 300 ASF × 140 sec. | 35.8 |
| 25 | 2 | 300 ASF × 140 sec. | 31.3 |
| 28 | 2 | 300 ASF × 140 sec. | 22.4 |
| 29 | 2 | 300 ASF × 140 sec. | 22.4 |
| 33 | 2 | 300 ASF × 140 sec. | 21.5 |
| 36.5 | 2 | 300 ASF × 140 sec. | 30.7 |

Table 5 illustrates that the sheet resistance of the deposited resistive layer is significantly lower with a currently density of 300 amperes per square foot than with a current density of 600 amperes per square foot.

TABLE 5
EFFECT OF VARYING ELECTROPLATING CURRENT
DENSITY ON RESISTANCE OF CHROME RESISTOR
LAYER

Solution Chemistry -  $CrO_3$: 247.5 g/l
Acetic Acid: 211 g/l
$H_2SO_4$: 250 ppm
Solution Temperature: 28° C.

| C.D. × Time | Charge Density (Coul/Ft$^2$) | Sheet Resistance (Ohm/Sq) |
|---|---|---|
| 300 ASF × 200 Sec. | 60,000 | 10.5 |
| 600 ASF × 100 Sec. | 60,000 | 62.3 |
| 300 ASF × 240 Sec. | 72,000 | 8.5 |
| 600 ASF × 120 Sec. | 72,000 | 45.5 |
| 300 ASF × 280 Sec. | 84,000 | 7.0 |
| 600 ASF × 140 Sec. | 84,000 | 34.8 |

The deposition of chromium is promoted when sodium chlorate is added to a resistive chrome electroplating bath such as one containing 300 grams per liter $CrO_3$, 200 grams per liter acetic acid and 100 ppm sulfuric acid. The presence of sodium chlorate in the bath results in lower sheet resistances as shown in Table 6. In generating the data set forth in Table 6, the current density was 300 amps/sq. ft., the bath temperature was 30° C., and the plating time was 45 seconds in each case. It is believed that the presence of the chlorate simply results in an increase in the deposition rate of the chromium. When chlorates and other oxyhalides are used in the plating bath, the electroplating operation is more efficient and more easily controlled.

TABLE 6
EFFECT OF VARYING SODIUM CHLORATE
IN ELECTROPLATING BATH ON RESISTANCE
OF CHROME RESISTOR LAYER

| $NaClO_3$ in bath (g/l) | Sheet Resistance (Ω/sq.) |
|---|---|
| 0.4 | 163.2 |
| 0.5 | 80.1 |
| 0.6 | 38.4 |
| 0.75 | 17.5 |
| 1.0 | 10.7 |
| 1.5 | 7.7 |
| 2.5 | 5.9 |

Acetic acid is used as the organic acid in the experiments used to develop the data for the foregoing tables. However, it has been determined that propionic acid may be one of the best presently known materials for use as a source of carbon and oxygen in the chromium resistive layer. Thus, a bath was prepared to contain 300 grams per liter $CrO_3$, 15 ml per liter of propionic acid, and 3 grams per liter of sodium chlorate. The plating conditions were a bath temperature of 22° C., a current density of 75 amps per square foot, and a plating time of 45 seconds. The resistive layer thus produced had a sheet resistance of 25 $\Omega$ per square.

Examples of bath chemistries and modes of operation of certain plating bath formulations are set forth in the following Table 7. The plating operations were conducted in a horizontal beaker cell and in each case a sheet resistance of 25 per square was achieved. In accordance with the invention, the copper substrate is used as the cathode in the process and the resistive chromium layer is electrodeposited directly onto the matte side of the plain and stabilized copper foil.

TABLE 7

PREFERRED ELECTROPLATING BATH FORMULATIONS AND MODES OF OPERATION

| | Formulations | | |
|---|---|---|---|
| | I | II | III |
| $CrO_3$ (g/l) | 300 | 300 | 300 |
| $H_2SO_4$ (g/l) | .2-.3 | .2-.3 | .2-1.0 |
| Sodium Chlorate (g/l) | — | 2.5 | 3.0 |
| Acetic Acid (g/l) | 150 | 150 | — |
| Propionic Acid (ml/l) | — | — | 40 |
| Solution Temperature (°C.) | 28-30 | 28-30 | 28-30 |
| Current Density (ASF) | 300 | 300 | 75 |
| Plating Time (seconds) | 100 | 25-30 | 44 |
| Electrode Gap (inches) | 2 | 2 | 2 |
| Substrate | LP-P&S* | LP-P&S* | LP-P&S* |
| Agitation | None | None | None |

*This designation refers to low profile (LP) copper foil which has a thickness of about 35μ and an average roughness of less than about 1μ and which is plain (untreated other than stabilization) and stabilized (P&S).

In the above table, Formulation III is preferred primarily because this formulation enables one to achieve high current efficiency and greater deposit uniformity.

The result of each plating operation is a multiple layer foil that comprises an electrodeposited resistive chromium layer having a thickness of about 0.25 to about 0.35 μ and a conductive copper layer having a thickness of about 35 μ. The resistive layer produced by electroplating Formulation I has a chromium content of about 90 weight percent, a carbon content of about 0.64 weight percent and an oxygen content of about 2.83 weight percent, so that the atom ratio of carbon to chromium is about 0.031:1 and the atom ratio of oxygen to chromium is about 0.10:1.

The resistive layer produced by electroplating Formulation III also has a chromium content of about 90 weight percent, but has a carbon content of 0.063 weight percent and an oxygen content of about 0.39 weight percent, so that the atom ratio of carbon to chromium is about 0.003 and the atom ratio of oxygen to chromium is about 0.014:1.

The sheet resistance of each resistive layer prepared according to Table 7 is within the preferred 15 to 1,000 $\Omega$ per square range and the resistivity of each is greater than about 600 $\Omega$ per cm.

A multiple layer foil produced using plating bath Formulation III chemistry and operating conditions as set forth in Table 7 was bonded, with the copper conductive layer facing out, to a prepreg consisting of plurality of woven glass layers coated initially with a partially cured epoxy liquid resin. Such prepregs are well known to those skilled in the art and are readily available commercially. The bonding operation consists of the application of heat and pressure to the structure and the result is a laminate 10 as illustrated in FIGS. 1 and 2, where the multiple layer foil is identified by the reference numeral 14, the copper conductive foil layer is identified by the reference numeral 18, the resistive chromium layer is identified by the reference numeral 16 and an insulative layer produced by the application of heat and pressure to the prepreg is identified by the reference numeral 12. The thicknesses of the various layers shown in the drawings are not necessarily to scale.

The resistive layers produced in accordance with the invention described herein have excellent thermal and aging stability. The chromium resistive layers, for example, generally have a temperature coefficient of resistance below about 300 ppm/° C. in the 20° C. to 100° C. temperature range. That is to say, for sheet resistances of about 25 $\Omega$ per square, for example, the sheet resistance in the stated temperature range will increase about 0.0075 $\Omega$ per square for each degree Celsius of temperature increase.

With regard to aging stability, storage in ambient air for 26 weeks, storage in an atmosphere having 70% relative humidity at 40° C. for 18 hours, or exposure to air at 125° C. for 4 hours all result in a net change of less than 1.5% for the chromium composite sheet resistances.

Chromium- and/or oxygen-containing resistive layers, such as chromium.carbon.oxygen resistive layers, also are resistant to corrosion, a property which contributes greatly to product stability during storage, further processing operations and field applications.

Several advantages result from the use of a resistive material comprising an electrodeposited layer of a composite of chromium and a resistance increasing amount of a non-metallic additive such as oxygen or sulfur and/or carbon, nitrogen and/or phosphorus. Chromium-containing resistive materials, such as chromium.carbon.oxygen resistive materials, resist etching by copper etchants, such as a cupric chloride/hydrochloric acid etchant, and such etchant may therefore be utilized to selectively remove copper. This facilitates the control of the etching procedure which results in an increase in the quality of the end product.

Although resistive chromium layers may be etched using a chromic acid etchant, the etching steps do not require the use of chromic acid as a reagent. This reduces environmental problems associated with disposal of chromic acid and chromic acid contaminated materials. In this connection, the chromium resistive materials of the invention are also unetchable by $H_2O_2/H_2SO_4$, $FeCl_3$, alkaline ammoniacal and $CuCl_2$ etchants (which do remove copper) whereby an etchant may be selected to provide an appropriate differential etch rate depending upon the etch characteristics of the particular conductive and resistive layers employed.

This ability to conduct differential etching according to this invention may be conducted with other resistive and conductive layers when the appropriate etchants are selected.

In another aspect of the invention of the present application, a resistive layer is provided comprising an electrodeposited layer of a composite of a normally conductive metal, such as nickel, and a resistance increasing amount of sulfur as the non-metallic additive. In preparing the nickel.sulfur resistive material of the invention, a bath may be used which comprises nickel sulfate as a source of the normally conductive metal nickel, sodium thiosulfate as a source of a non-metallic resistance increasing additive and boric acid as a pH buffering agent. For example, a nickel.sulfur resistive layer may be produced using a plating bath made up of an aqueous solution containing 100 grams per liter nickel sulfate ($NiSO_4 \cdot 6H_2O$), 30 grams per liter boric acid ($H_3BO_3$) and 50 grams per liter sodium thiosulfate ($Na_2 S_2O_3 \cdot 5H_2O$). Such solution as initially prepared will be moderately acidic such that its pH is in the neighborhood of about 3.2. The pH may be adjusted before plating by adding a sufficient quantity of sodium hydroxide (NaOH) to bring the pH of the solution to about 6, as measured by a pH meter. The electroplating bath solution may then be heated to a temperature of about 45° C., and while maintained at that temperature, a conductive copper foil layer to be plated upon is connected as the cathode of a beaker electroplating apparatus and is immersed in the plating bath. An electric current having a current density of from about 10 to about 40 amperes per square foot is then caused to flow through the plating bath whereupon a nickel sulfur composite layer plates out on the copper foil.

A plating bath containing 100 grams per liter nickel sulfate, 30 grams per liter boric acid and 10 grams per liter sodium thiosulfate may also be employed. Again the pH of the solution is generally adjusted to about 6 by the addition of sodium hydroxide. The concentration of each of the materials may be altered to provide different effects. Higher concentrations of nickel sulfate in the bath generally result in higher concentrations of nickel in the electrodeposited resistive layers, thereby increasing the conductivity (i.e., decrease the sheet resistance) of the electrodeposited layer.

Higher levels of nickel sulfate, however, generally result in greater chemical loss during the electroplating process due to drag out. Higher concentrations of sodium thiosulfate will generally produce higher levels of sulfur in the electrodeposited resistive layer, which generally increase the sheet resistance of the electrodeposited layer.

In preparing the nickel.sulfur resistive layers, the current density and plating time may be varied to obtain different results. Since the cross-sectional area of the nickel.sulfur layer generally determines sheet resistance, different thicknesses of the layer will provide different resistances. By passing a certain amount of coulombic charge through the solution, a certain definite thickness of material is deposited.

The current density may be varied from about 10 to about 40 amperes per square foot and the plating time may be varied from about 30 to about 120 seconds.

For example, the plating time may be varied from about 30 seconds at a current density of 40 amperes per square foot to about 120 seconds at a current density of 10 amperes per square foot. Within these ranges, the thickness of the electrodeposited resistance layer increases linearly with increased plating time and sheet resistance thus decreases with increased plating time. Nickel.sulfur resistance layers in accordance with the invention electroplated upon a conductive copper foil substrate using 1200 coulombs of electrical charge will have thicknesses of about 0.4 $\mu$ and sheet resistances of about 25 $\Omega$ per square.

As an optional step, after the multiple layer resistive foil is removed from the plating bath, the same may be immersed in a solution of chromic acid ($CrO_3$) at a concentration of about 2 grams per liter to stabilize the multiple layer resistive foil.

The nickel.sulfur composite layer formed on a conductive copper foil in the above described example using the above described bath, plating times and current densities will possess a sheet resistance of about 25 $\Omega$ per square. The nickel resistive layers thus formed are very stable. Even after exposure to air for extended periods of time, the sheet resistance values have been found to vary on the average by less than about 2%.

The higher sheet resistances of the chromium and nickel containing resistive layers is believed to arise from the inclusion of the impurities into the metallic deposit. However, the inventors do not wish to be bound by any particular theory of how their invention achieves its intrinsic advantages.

In general, the intrinsically greater sheet resistance of the resistive layers of the present invention allows the layer to be applied over the entire surface of the conductor, without the necessity for using mechanical or chemical means for thinning or removing the layers in selected areas to thereby decrease the effective cross-sectional area of the layers to achieve the desired sheet resistance at localized positions. Rather, the desired sheet resistance may be achieved by varying the chemical content of the electroplating bath and/or the electroplating conditions.

That the intrinsically greater sheet resistance is substantially uniform throughout the bulk of the resistive layer is believed to be due to the non-metal being uniformly distributed throughout the crystal lattice in the bulk material. However, the inventors do not wish to be bound by any particular theory of how their invention achieves its intrinsic advantages.

The resistive layers of the invention are utilized in such a manner as to entirely cover the conductor surface. Moreover, after the resistive layer has been laminated to a dielectric substrate and the conductor removed in the desired areas, the resistive layer completely covers the dielectric substrate. When the resistor has been defined correctly by using proper masking design and art work, post-processing of the resistive material by mechanical and/or chemical means is not required to achieve the desired resistance.

The thickness of above-mentioned layer 16, for example, may be varied to achieve the commercially required dimensions of the planar resistor and sheet resistance thereof. The thickness of the conductive layer 18 does not effect the resistance of the resistor. Typically a layer 16 produced in accordance with the invention to achieve a sheet resistance of 25 $\Omega$/square will have a thickness in the range of from about 0.1 to about 0.4 $\mu$.

In accordance with the invention, the targeted sheet resistance range may be from about 15 to about 1000 $\Omega$ per square. Functional resistors can be made with any sheet resistance in this range by controlling the geometry of the etched resistor, i.e., by varying the length and the width of the etched resistor on the circuit board. Inside this resistance range, a sheet resistance value of about 25 $\Omega$ per square is often preferred for simplification of production processes. Thus, by controlling the plating time, almost any of the above-described plating bath conditions, such as concentration of bath ingredients and temperatures, may be employed to produce resistors having a predetermined sheet resistance, such as about 25 Ω per square.

Combined with proper physical and topographical design, sheet resistances of 25, 100 and 1000 Ω/square can be achieved in accordance with the present invention and conveniently employed to make planar resistors having resistances in the commercially desirable range of from 1 Ω to 1 Mega Ω. The resistors of the invention may be mass produced within narrow error tolerance specifications. Reproduceability within ±2.5 percent or less of the targeted resistivity may be achieved.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. A resistive layer comprising a composite of a normally conductive metal component and a resistance increasing amount of a non-metallic additive wherein
    said metal component comprises chromium;
    said non-metallic additive comprises an average of at least about 0.001 atom of carbon or nitrogen, or combination of two or more of carbon, nitrogen and phosphorus, per atom of said normally conductive metal component in the bulk of the resistive layer; and
    said metal component comprises an average of at least about 80 weight percent of the bulk of the resistive layer.

2. The resistive layer of claim 1 wherein the resistive layer has a sheet resistance in the range from about 15 to about 1000 Ω per square when the resistive layer has a thickness in the range from about 0.1 to about 0.4 micron.

3. The resistive layer of claim 1 wherein the bulk of the resistive layer comprises at least about 0.01 atom of oxygen per atom of said metal component.

4. The layer of claim 1 wherein the bulk of the resistive layer comprises an average of at least about 80 weight percent chromium.

5. The resistive layer of claim 1 wherein the bulk of the resistive layer comprises an average of at least 0.001 atom of carbon per atom of said metal component.

6. The resistive layer of claim 1 wherein the said metal component further comprises cobalt, vanadium, molybdenum or tungsten.

7. The resistive layer of claim 1 wherein
    said non-metallic additive comprises an average of at least about 0.01 atom of oxygen and at least about 0.001 atom of carbon per atom of said metal component in the bulk of the resistive layer; and
    chromium comprises an average of at least about 80 weight percent of the bulk of the resistive layer.

8. A resistive layer comprising a composite of a normally conductive metal component and a resistance increasing amount of a non-metallic additive wherein
    said metal component comprises the combination of chromium and a metal selected from the group consisting of cobalt, vanadium, molybdenum or tungsten; and
    said non-metallic additive comprises an average of at least about 1 atom of carbon, nitrogen or phosphorus, or a combination of two or more of carbon, nitrogen or phosphorus, per 1000 atoms of said metallic component.

9. The resistive layer of claim 8 wherein said metal component comprises an average of at least about 80 weight percent of the bulk of the resistive layer.

10. The resistive layer of claim 8 wherein said non-metallic additive comprises an average of at least about 0.01 atom of oxygen and at least about 0.001 atom of carbon per atom of said metal component in the bulk of the resistive layer.

11. A resistive layer comprising a composite of a said normally conductive metal component and a resistance increasing amount of a said non-metallic component wherein
    said metal component comprises chromium;
    said non-metallic additive comprises carbon and oxygen; and
    the resistive layer has a thickness in the range from about 0.1 to about 0.4 microns and a sheet resistance in the range from about 15 to about 1000 Ω per square.

12. The resistive layer of claim 11 wherein the resistive layer has a bulk resistivity greater than about 600 μΩ.cm.

13. The resistive layer of claim 11 wherein the bulk resistive layer comprises a body centered cubic crystal lattice structure and a simple cubic crystal lattice structure as determined by X-ray diffraction analysis.

14. The resistive layer of claim 13 wherein the simple cubic crystal lattice structure comprises a minor phase of the crystal lattice structure of the resistive layer.

15. A multiple layer foil comprising the resistive layer of claim 1 on a conductive foil layer.

16. A multiple layer foil comprising the resistive layer of claim 7 on a conductive foil layer.

17. A multiple layer foil comprising the resistive layer of claim 8 on a conductive foil layer.

18. A multiple layer foil comprising the resistive layer of claim 10 on a conductive foil layer.

19. A multiple layer foil comprising the resistive layer of claim 11 on a conductive foil layer.

20. A laminate comprising the resistive layer of claim 1 adhered to an insulative layer.

21. The laminate of claim 20 further comprising a conductive foil layer adhered to the resistive layer.

22. A laminate comprising the resistive layer of claim 7 adhered to an insulative layer and a conductive foil layer adhered to the resistive layer.

23. A laminate comprising the resistive layer of claim 8 adhered to an insulative layer and a conductive foil layer adhered to the resistive layer.

24. A laminate comprising the resistive layer of claim 10 adhered to an insulative layer and a conductive foil layer adhered to the resistive layer.

25. A laminate comprising the resistive layer of claim 11 adhered to an insulative layer and a conductive foil layer adhered to the resistive layer.

26. A printed circuit board comprising an insulative layer and a resistive line bonded to the insulative layer, said resistive line comprising a composite of a normally conductive metal component and a resistance increasing amount of a non-metallic additive wherein
    said metal component comprises chromium;
    said non-metallic additive comprises an average of at least 0.001 atom of carbon or nitrogen, or a combination of two or more of carbon, nitrogen and phosphorus, per atom of said normally conductive metal component in the bulk of the resistive layer; and said metal component comprises an average of at least 80 weight percent of the bulk of the resistive layer.

27. A printed circuit board comprising an insulative layer and a resistive line bonded to the insulative layer, said resistive line comprising a composite of a normally conductive metal component and a resistance increasing amount of a non-metallic additive wherein said metal component comprises the combination of chromium and a metal selected from the group consisting of cobalt, vanadium, molybdenum or tungsten; and said non-metallic additive comprises an average of at least about 1 atom of carbon, nitrogen or phosphorus, or a combination of two or more of carbon, nitrogen or phosphorus, per 1000 atoms of said metallic component.

* * * * *